Feb. 2, 1965 R. STENGL 3,167,852

METHOD OF MAKING AN ELECTRICAL SWITCH

Filed Oct. 26, 1960 2 Sheets-Sheet 1

INVENTOR.
Robert Stengl
BY.
Olson, Mecklenburger, von Holst,
Pendleton & Neuman. Atty's

METHOD OF MAKING AN ELECTRICAL SWITCH

Filed Oct. 26, 1960 2 Sheets-Sheet 2

INVENTOR.
Robert Stengl
BY
Olson, Mecklenburger, von Holst, Pendleton & Neuman, Attys.

3,167,852

METHOD OF MAKING AN ELECTRICAL SWITCH

Robert Stengl, Morton Grove, Ill., assignor to Standard Grigsby Inc., a corporation of Delaware Filed Oct. 26, 1960, Ser. No. 65,182
8 Claims. (Cl. 29—155.55)

This invention relates to an electrical switch and a method of manufacturing electrical switches, and more particularly to an improved rotary electrical switch of the wafer type and a method of manufacturing wafer switches which conserves material, reduces costs and results in mechanically and electrically improved devices.

In the electrical industry, rotary switches of the wafer type are extremely common. They are widely used in electronic equipment where multiple positions are required in sequencing, programing, channel selection, and the like. One very common use of such switches is in multiple channel television tuners. Typically, 3 or 4 wafer switches are stacked together and supported in spaced parallel relationship with a common operating shaft extending centrally therethrough. A single knob, usually designated the channel selector, rotates the central portion or rotor of each wafer switch to selectively tune various radio frequency circuits in the television receiver. In a typical design these circuits may include an antenna circuit, an R-F amplifier, a mixer input, and a conversion oscillator. Heretofore the rotary wafer switches employed in television tuners and in similar applications have been relatively large and costly to manufacture. While it is desirable to minimize the stray electrical effects produced by the switch components, prior art devices have often exhibited large and unpredictable stray effects.

It is, therefore, one object of this invention to provide a mechanically improved wafer switch of substantially reduced size.

It is still another object of this invention to provide a small wafer switch having improved structural rigidity, good bearing characteristics for the switch rotor, and a wafer switch in which the plurailty of spaced contacts do not support the rotor and are not employed as a structural element in the switch.

It is still another object of this invention to provide an improved rotary wafer switch having a minimum amount of stray electrical effects and, more particularly, having minimum intercontact and stray capacitance.

A further object is the creation of an electrically improved switch in which positive low impedance contact is produced at all times between the various switch elements.

It is a further object of this invention to provide an improved miniature electrical switch having means incorporated therein for tuning certain of the switch components which then function also as components of a tuned circuit.

Another object of this invention is the provision of improved assembly techniques and processes for the manufacture of wafer switches. The assembly process of this invention saves substantial quantities of raw material, enables a reduction in the size of the ultimate product, is well adapted to automation, requires minimum handling of the component parts, and greatly reduces defective products and waste materials.

Further and additional objects of this invention will become manifest from a consideration of this specification, the accompanying drawings and the appended claims.

In one form of the invention a miniature wafer switch for use in television receivers is provided in which a circular pattern of electrical contacts is initially connected together by an inner ring and assembled onto an insulating stator. Thereafter the removal of the supporting ring by the passage of a metal punching tool through a central aperture in the stator produces a completed multi-contact stator assembly. The supporting ring and the inner portions of the various contacts are formed with offset portions whereby they are spaced from the plane of the stator to define an annular recess which receives radial fingers extending outwardly from the associated rotor. The fingers of the rotor are so shaped and spaced that they pass between the various contacts and produce bearing surfaces against the periphery of the central aperture in the stator. A retaining ring is then secured to the opposite side of the rotor whereby the peripheral portions of the stator defining the central aperture are entrapped beween the fingers and the retaining means. Thus, the electrical contacts do not support the rotor in any way and are not required to function as mechanical elements in addition to serving their electrical purposes.

For a more complete understanding of the invention, reference will now be made to the accompanying drawings, wherein.

Figures 1, 4, 5, 6, 7:
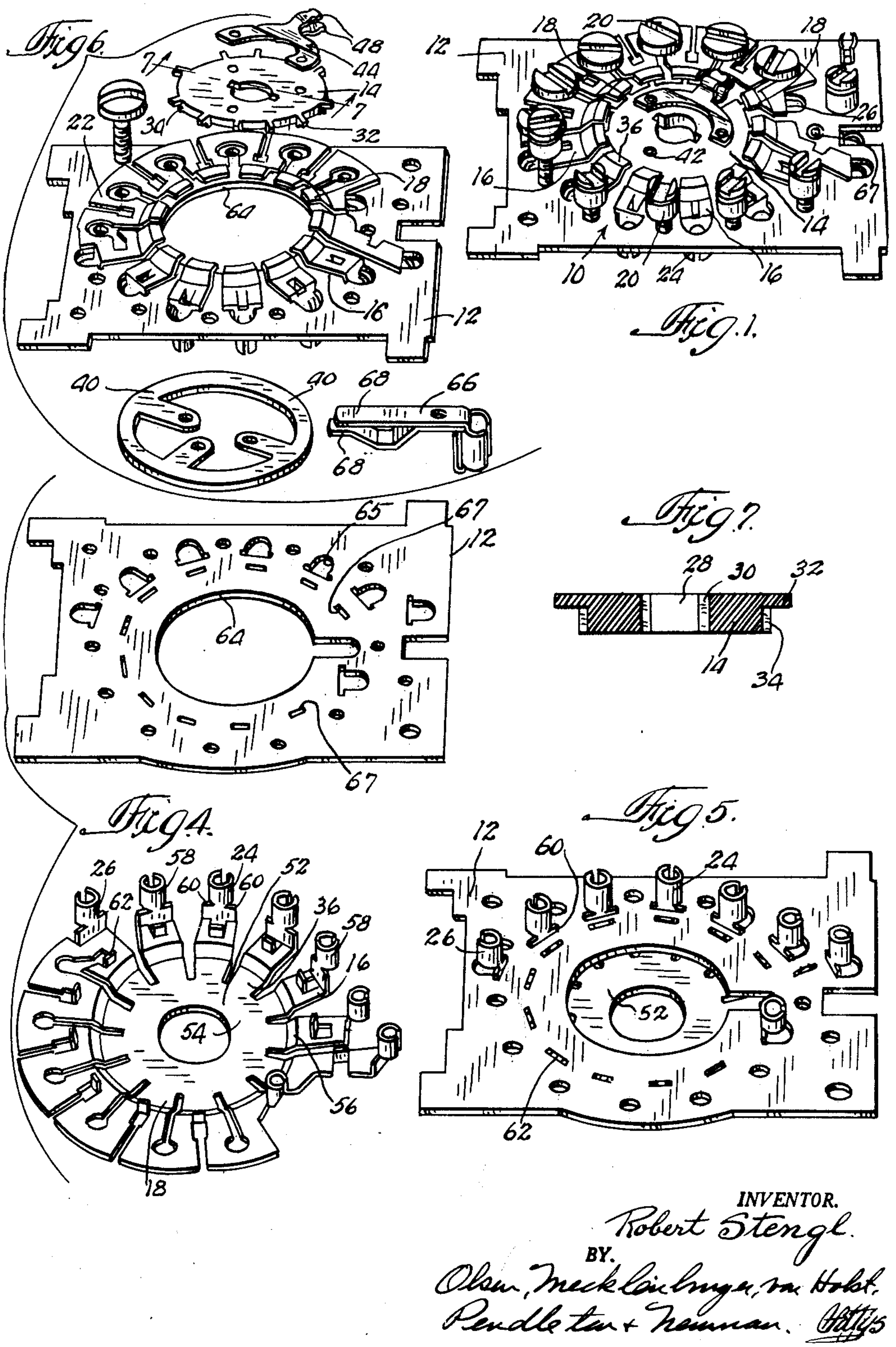
FIGURE 1 is a perspective view of a wafer switch normally forming a part of a television tuner and illustrating one embodiment of the article provided by this invention.
FIG. 4 is an exploded view of the stator and preformed contact assembly during one step of the manufacturing process of this invention.
FIG. 5 illustrates the parts shown in FIG. 4 but in assembled relationship.
FIG. 6 is an exploded view illustrating another step in the manufacturing process and incorporating the subassembly of FIG. 5 in an inverted position.
FIG. 7 is a cross-sectional view of the rotor taken on the line 7—7 of FIG. 6.
Figure 3:
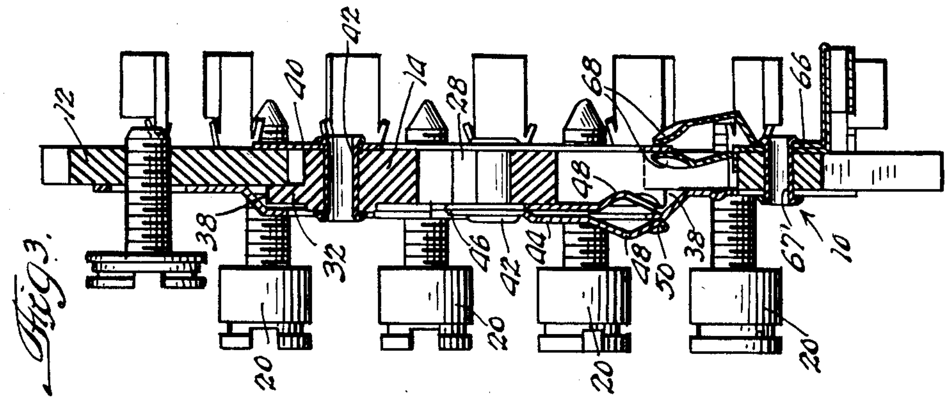
FIG. 3 is a sectional view of the wafer switch of FIG. 1 taken on the line 3—3 of FIG. 2.
Figure 2:
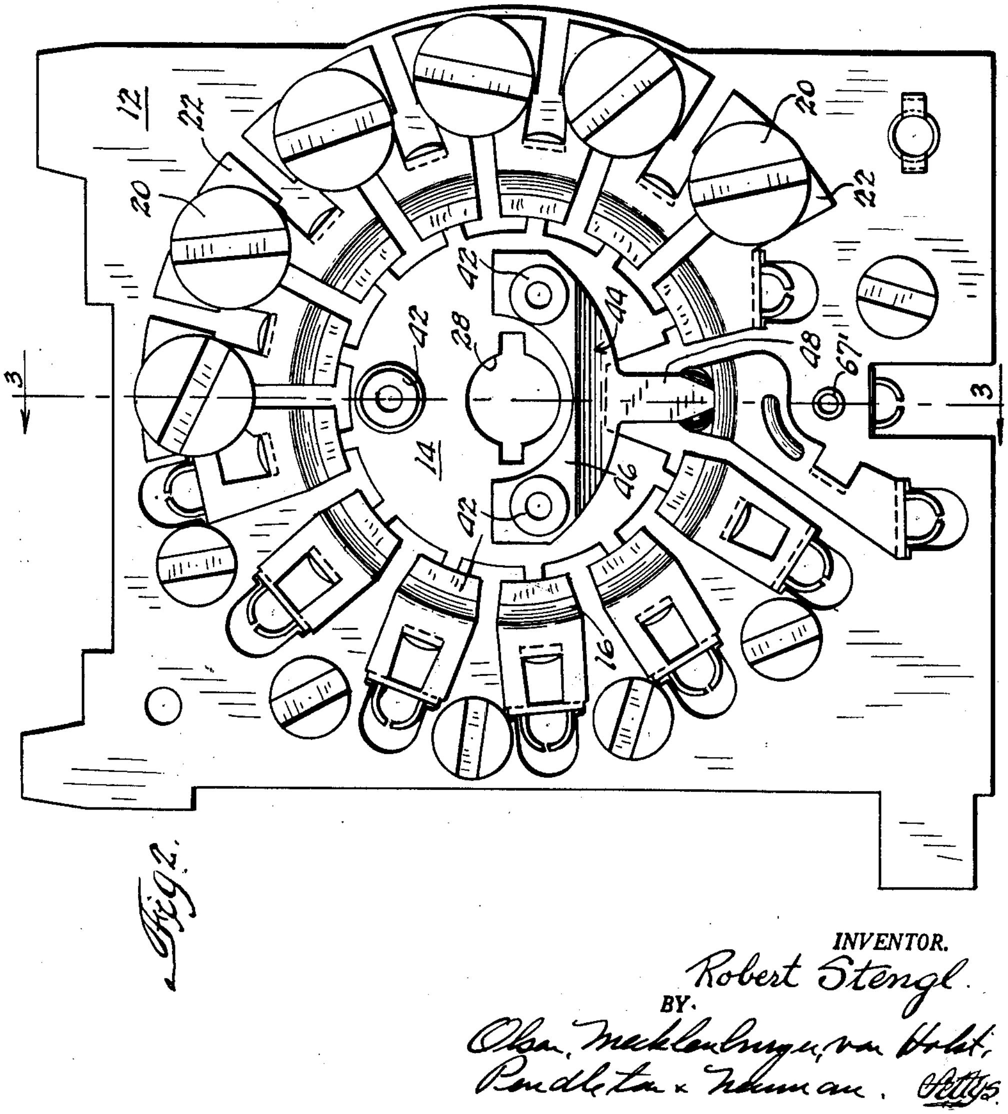
FIG. 2 is a top plan view of the wafer switch of FIG. 1.

Referring now to the drawings and more particularly to FIGS. 1, 2 and 3, a wafer switch 10, having a stator 12 and rotor 14, is illustrated. The stator 12 and rotor 14 are made of an insulating material, such as a phenol sheet or molded plastics, such as polystyrene or polyethylene. Individually secured to the stator 12 are a plurality of electrically isolated contacts 16. A further group of contacts 18 individually secured to stator 12, but electrically interconnected, are provided to complete a uniform circular pattern with contacts 16.

Threaded elements such as screws 20, are disposed between the electrically isolated contacts 16 and adjacent to the bight portions of the interconnected contacts 18. The screws 20, which are preferably made of brass, constitute tuning elements where desired in high frequency electrical circuit. In particular, in a TV tuner the upper or high frequency channels are selected by engaging one of the interconnected contacts 18 and the frequency involved is in the order of 200 megacycles. At such frequencies the U-shaped portions interconnecting the contacts 18 form the tunable components of a tuned circuit incorporated in the wafer switch. Thus, between each of the contacts 18 the flat metallic U-shaped portion 22 defines an inductive element. The brass screws 20, passing through the stator adjacent to but electrically isolated from the tunable element, varies the inductance of that element and determines the frequency of the tuned circuit when the switch is used in conjunction with a predetermined capacitance. For this reason, it is important to minimize the stray and unpredictable capacitance effects which sometimes occur between switch elements. The instant invention accomplishes this in a unique manner by providing maximum space between the conductive components. Furthermore, air constitutes the intermediate medium wherever possible to avoid the larger capacitance effects produced by the higher dielectric rotor and stator materials.

Each contact 16 has a terminal portion 24 which passes through an appropriate small aperture in stator 12. The contacts 16 and 18 are preferably secured in the stator 12 by a staking operation. A single terminal 26 provides the electrical connection for all of the interconnected contacts 18. The rotor 14, as best shown in FIG. 7, has a central aperture 28 with keyways 30 to receive a keyed drive shaft. The periphery of rotor 14 has radial fingers 32 adjacent one surface thereof and narrow peripheral ribs 34 aligned with fingers 32 and disposed on the peripheral edge of the rotor. The ribs and fingers are so proportioned and spaced that they pass freely through the spaces between adjacent contacts 16 and 18. The radial inward portions 36 of contacts 16 and 18 are offset from the plane of stator 12 such that their shape defines an annular recess. Thus, when the rotor is in position the radial fingers 32 occupy the recess 38.

The rotor is retained in position by a conductive ring 40 which is secured to the side of the rotor opposite fingers 32 by rivets 42. Also, secured to rotor 14 by rivets 42 is a conductive wiper 44. Wiper 44 has an arcuate portion 46 partially surrounding the central rotor aperture 28 and receiving two of the rivets 42. Extending radially outward from the arcuate portion 46 are a pair of wiper arms 48, which engage any one of the contacts 16 or 18 selectively depending upon the relative rotary position of rotor 14 and stator 12. Wiper arms 48 have somewhat cupped end portions 50 to produce more positive and low resistant contact with the individual contacts 16 and 18.

A similar pick-off wiper 66 is secured in stator 12 and continuously engages ring 40 for completing the selected circuit. The steps in the manufacture of this switch are best illustrated in FIGS. 4, 5 and 6. In FIG. 4 a preformed contact assembly 52 includes a central supporting ring 54 and all of the preformed contacts 16 and 18. The supporting ring 54 and radially inward contact portions 36 are positioned in a plane slightly removed from the plane of the remainder of the preform 52 and connected thereto by the inclined intermediate portions 56, thus defining annular recess 38. Each contact 16 and contact 18 have a terminal portion 24 or 26 formed normally to the stator plane with an arcuate solder lug 58. Adjacent to solder lug 58 small shoulders 60 are defined, and spaced from shoulders 60 are transverse clamping studs 62. As is clear in FIG. 4 the stator 12 has preformed apertures 65 to receive the terminal portions 24 and 26 and has preformed adjacent slots 67 to receive the clamping studs 62. Thus, when the preform 52 is placed in overlying relationship on stator 12, a sub-assembly, as shown in FIG. 5, results. A staking tool is then applied which deforms or splits the clamping studs 62 and the shoulders 60, whereby each contact 16 and the contacts 18 are permanently located in the stator 12.

The next step in assembly is illustrated in FIG. 6 where the rotor 14, wiper 44 and retaining ring 40 are shown in an exploded view. The rotor 14 is dropped into place from the position shown in FIG. 6 with the radial fingers 32 nesting between the contacts 16 and 18 and coming to rest on the surface of stator 12. The wiper 44 is then placed on the rotor 14 with the apertures aligned and with the wiper arms 48 entrapping one of the contacts 16 or 18. Three rivets are then passed through apertures in the wiper 44, rotor 14 and retaining ring 40, with the retaining ring against the opposite face of stator 12. When the rivets are deformed a permanent assembly results with selective contact between the wiper arms 48 and any one of the contacts 16 or 18. The radial ribs 34 bear against the inner edge 64, which defines the central aperture in stator 12 and thus a restrained and accurate but relatively low friction rotary movement is provided. This is true even though the inner edges of contacts 16 and 18 may fall somewhat within the cylinder defined by the central aperture. The pick-off wiper 66 is then secured to stator 12 by rivet 67′ and has spaced arms 68 which continuously engage collector ring 40.

This combination of wiper and contacts provides a continuous connection to a circuit associated with one of the pre-selected contacts 16 or 18, as will be understood readily from the foregoing description and the drawings. An electrical circuit is at all times completed through the rotary switch from the pick-off wiper 66 through the retaining ring 40, the rivets 42, the wiper 44, and one of the contacts 16 or 18. The contacts 18 are connected together through inductive portions 22 and a single terminal 26 connects the contacts 18 to other circuit components in a tuned circuit. Each of the contacts 16 is individually connected through an associated circuit component, such as a predetermined inductance coil to the same tuned circuit. Thus, by turning the rotor 14 any one of thirteen predetermined positions may be selected.

A detent mechanism is normally associated with the knob and shaft employed with such a wafer switch to positively determine the 13 selected positions. However, as these are conventional elements, they are not illustrated in the instant drawings. Also, while the particular switch illustrated has 13 positions corresponding to the 13 VHF television channels, it will be immediately apparent that the wafer switch and method of manufacture provided by this invention have many applications irrespective of the number of contacts employed or associate circuit components. One particular advantage of the instant invention is the fact that the contactst do not support the rotor in position and thus a full set of contacts formed completely about the periphery of the central aperture is not required. If desired in a particular use, only two or three contacts, either immediately adjacent to one another or distributed about the periphery, might be used.

Without further elaboration, the foregoing will so fully explain the character of my invention that others may, by applying current knowledge, readily adapt the same for use under varying conditions of service, while retaining certain features which may properly be said to constitute the essential items of novelty involved, which items are intended to be defined and secured to me by the following claims.

I claim:

1. The method of assembling a multiple contact switch element comprising forming from a generally planar sheet of metal an assembly of circumferentially disposed contacts each having a radially remote free terminal portion, an intermediate mounting portion and a radially inward contact portion, positioning said contact portions in a plane spaced from the plane of said terminal and mounting portions while maintaining said contact portions in interconnected relationship through a radially inward integral connecting ring, securing said mounting portions on an insulating stator having a central aperture, removing said connecting ring by passing a tool through said central aperture to render said contacts electrically independent and to define an annular recess between said contact portions and said stator and placing an insulating rotor with outer projecting portions thereof extending into said annular recess and retaining said insulating rotor for selective cooperative engagement with said contacts.

2. The method of assembling a multiple contact switch element comprising forming from a generally planar sheet of metal an assembly of circumferentially disposed contacts each having a free radially remote transversely extending terminal portion, an intermediate mounting portion and a radially inward contact portion, positioning said contact portions in a plane spaced from the plane of said mounting portions away from said terminal portions while maintaining said contact portions in interconnected relationship through a radially inward integral connecting ring, passing said terminal portions through appropriate apertures in an insulating stator having an enlarged central aperture whereby said connecting ring is aligned with said central aperture and an annular recess is defined between said contact portions and the peripheral portion of said stator adjacent said central aperture, removing said connecting ring by passing a tool through said central aperture to render said contacts electrically independent and placing an insulating rotor with outer projecting portions thereof extending into said annular recess and retaining said insulating rotor for selective cooperative engagement with said contacts.

3. The method of assembling a multiple contact switch comprising forming from a generally planar sheet of metal an assembly of circumferentially disposed contacts each having a free radially remote transversely extending terminal portion, an intermediate mounting portion and a radially inward contact portion, positioning said contact portions in a plane spaced from the plane of said mounting portions away from said terminal portions while maintaining said contact portions in interconnected relationship through a radially inward integral connecting ring, passing said terminal portions through appropriate apertures in an insulating stator having an enlarged central aperture whereby said connecting ring is aligned with said central aperture and an annular recess is defined by said contact portions and the peripheral portion of said stator adjacent said central aperture, removing said connecting ring by passing a tool through said central aperture to render said contacts electrically independent, fitting an insulating rotor into said central aperture with outer projecting portions thereof passing between said contacts and occupying said annular recess, and securing a retainer to said rotor on the terminal side of said stator whereby said peripheral stator portion is entrapped between said retainer and said outer rotor portions.

4. The method of assembling a multiple contact switch comprising providing an insulating stator having an enlarged central aperture therein, securing a plurality of contacts to said stator in spaced relationship circumferentially of said aperture, shaping said contacts such that an annular recess is defined between said contacts and said stator immediately adjacent said aperture, fitting an insulating rotor into said central aperture with outer projecting portions thereof extending radially beyond said central aperture passing between said contacts and occupying said annular recess, and securing a retainer to said rotor opposite said contacts whereby said retainer extends radially beyond said aperture and said stator is entrapped between said retainer and said outer rotor portions.

5. The method of assembling a multiple contact switch comprising forming from a generally planar sheet of metal an assembly of circumferentially disposed contacts each having a free radially remote transversely extending terminal portion, an intermediate mounting portion and a radially inward contact portion, positioning said contact portions in a plane spaced from the plane of said mounting portions away from said terminal portions while maintaining said contact portions in interconnected relationship through a radially inward integral connecting ring, passing said terminal portions through appropriate apertures in an insulating stator having an enlarged central aperture whereby said connecting ring is aligned with said central aperture and an annular recess is defined by said contact portions and the peripheral portion of said stator adjacent said central aperture, removing said connecting ring by passing a tool through said central aperture to render said contacts electrically independent, fitting an insulating rotor into said central aperture with outer projecting portions thereof passing between said contacts and occupying said annular recess, securing a retainer to said rotor on the terminal side of said stator whereby said peripheral stator portion is entrapped between said retainer and said outer rotor portions, and securing a contact member to said stator to be in continuous electrical contact with said retainer, said retainer being conductive.

6. The method of assembling a multiple contact switch comprising forming from a generally planar sheet of metal an assembly of circumferentially disposed contacts each having a free radially remote transversely extending terminal portion, an intermediate mounting portion and a radially inward contact portion, positioning said contact portions in a plane spaced from the plane of said mounting portions away from said terminal portions while maintaining said contact portions in interconnected relationship through a radially inward integral connecting ring, passing said terminal portions through appropriate apertures in an insulating stator having an enlarged central aperture whereby said connecting ring is aligned with said central aperture and an annular recess is defined by said contact portions and the peripheral portion of said stator adjacent said central aperture, removing said connecting ring by passing a tool through said central aperture to render said contacts electrically independent, fitting an insulating rotor into said central aperture with outer projecting portions thereof passing between said contacts and occupying said annular recess, securing a retainer to said rotor on the terminal side of said stator whereby said peripheral stator portion is entrapped between said retainer and said outer rotor portions, securing a contact member to said stator to be in continuous electrical contact with said retainer, said retainer being conductive, and securing a radially extending contactor to said rotor electrically connected to said retainer and in engagement with any one of said contacts.

7. The method of assembling a multiple contact switch comprising providing an insulating stator having an enlarged central aperture therein, securing a plurality of contacts to said stator in spaced relationship circumferentially of said aperture, shaping said contacts such that an annular recess is defined between said contacts and said stator immediately adjacent said aperture, fitting an insulating rotor into said central aperture with outer projecting portions thereof extending radially beyond said central aperture passing between said contacts and occupying said annular recess, securing a retainer to said rotor opposite said contacts whereby said retainer extends radially beyond said aperture and said stator is entrapped between said retainer and said outer rotor portions, and securing a contact member to said stator to be in continuous electrical contact with said retainer, said retainer being conductive.

8. The method of assembling a multiple contact switch comprising providing an insulating stator having an enlarged central aperture therein, securing a plurality of contacts to said stator in spaced relationship circumferentially of said aperture, shaping said contacts such that an annular recess is defined between said contacts and said stator immediately adjacent said aperture, fitting an insulating rotor into said central aperture with outer projecting portions thereof extending radially beyond said central aperture passing between said contacts and occupying said annular recess, securing a retainer to said rotor opposite said contacts whereby said retainer extends radially beyond said aperture and said stator is entrapped between said retainer and said outer rotor portions, securing a contact member to said stator to be in continuous electrical contact with said retainer, said retainer being conductive, and securing a radially extending contactor to said rotor electrically connected to said retainer and in engagement with any one of said contacts.

References Cited in the file of this patent

UNITED STATES PATENTS

| | | |
|---|---|---|
| 1,592,326 | Bastian | July 13, 1926 |
| 2,561,930 | Klay | July 24, 1951 |
| 2,594,190 | Mastney | Apr. 22, 1952 |
| 2,631,211 | Klay | Mar. 10, 1953 |
| 2,641,050 | Graybill et al. | June 9, 1953 |

| | | |
|---|---|---|
| 2,666,253 | Morberg | Jan. 19, 1954 |
| 2,791,124 | Gossard | May 7, 1957 |
| 2,870,276 | Gelzer | Jan. 20, 1959 |
| 2,900,462 | Thomas et al. | Aug. 18, 1959 |
| 2,949,511 | Glueckstein et al. | Aug. 16, 1960 |
| 2,988,606 | Allison | Jan. 13, 1961 |
| 3,031,541 | Hoffmann | Apr. 24, 1962 |